United States Patent [19]

Betts

[11] 4,434,321
[45] Feb. 28, 1984

[54] MULTILAYER PRINTED CIRCUIT BOARDS

[75] Inventor: Dennis J. Betts, Goostray, England

[73] Assignee: International Computers Limited, Stevenage, England

[21] Appl. No.: 347,312

[22] Filed: Feb. 9, 1982

[30] Foreign Application Priority Data

Feb. 9, 1981 [GB] United Kingdom .................. 8103918

[51] Int. Cl.³ .............................................. H05K 1/11
[52] U.S. Cl. ..................... 174/68.5; 361/409; 361/414
[58] Field of Search ................ 174/68.5; 361/409, 414

[56] References Cited

U.S. PATENT DOCUMENTS

| | | | |
|---|---|---|---|
| 3,564,115 | 2/1971 | Gribble et al. | 361/414 |
| 3,621,116 | 11/1971 | Adams | 174/68.5 |
| 3,824,433 | 7/1974 | Newton | 361/409 X |
| 3,876,822 | 4/1975 | Davy et al. | 175/68.5 |
| 3,898,370 | 8/1975 | Davy et al. | 174/68.5 |
| 4,130,723 | 12/1978 | Wakeling | 174/68.5 |
| 4,298,770 | 11/1981 | Nishihara et al. | 174/68.5 |

FOREIGN PATENT DOCUMENTS

| | | | |
|---|---|---|---|
| 2305914 | 11/1976 | France | 361/409 |
| 1157268 | 7/1969 | United Kingdom | 174/68.5 |

Primary Examiner—R. R. Kucia
Attorney, Agent, or Firm—Lee, Smith & Jager

[57] ABSTRACT

A method or apparatus for facilitating the construction of prototype electronic circuits using printed circuit boards, by providing a printed circuit board 1, with a plurality of through connection bores 15 arranged in rows and columns, and with a conductive pad 4 at each end of each hole. A group of parallel conductive tracks 3 is provided on one face of the board substrate, the tracks 3 extending through the columns of pads 4, and a second group of conductive tracks 12 is provided on the other face of the board substrate, the tracks 12 being perpendicular to the tracks 3. The tracks 3 and 12 are connected to selected ones of the pads 4. In addition, conductive planes 5,9 are provided between the said first and second faces of the substrate, these planes being connected with selected ones of the plated through connections 15. Certain of the connections 15 are used for the purposes of mounting the connector pins of components. In use the track connections to the pads 4 are either augmented or removed as required.

3 Claims, 3 Drawing Figures

MULTILAYER PRINTED CIRCUIT BOARDS

BACKGROUND OF THE INVENTION

The present invention relates to multilayer printed circuit boards. Such multilayer printed circuit boards may include conductive tracks in one or more planes and conductive planes spaced from the tracks to provide common earth and power connections. Usually such printed circuit boards are designed to provide specific circuit arrangements and variation of these specific arrangements is not possible.

However it is often required to construct prototype circuits and it is desirable that such circuits be constructed on printed circuit boards. It is costly and time consuming to fabricate a multilayer board for each prototype circuit and hence it is desirable to provide a general purpose board having conductive tracks which can be interconnected and modified to form the required interconnections between components mounted on the board.

SUMMARIES OF THE INVENTION

According to one aspect of the present invention there is provided a method of facilitating the formation of prototype circuits utilising a printed circuit board comprising the steps of forming a plurality of through connections in an insulating substrate between first and second parallel planes of the substrate; providing a first group of parallel conductive tracks in said first plane, each such track being located adjacent to a column or columns of the through connections;

connecting selected ones of the through connections in said adjacent column or columns; providing a second group of parallel conductive tracks in the second plane each such track being located adjacent to a row or rows of the through connection, and being perpendicular to the first tracks; and connecting selected ones of the through connections in said adjacent row or rows; mounting circuit components at required locations of the substrate, with the mounting pins of the components engaging with selected ones of the plate through connections;

selectively forming discontinuities as required for the prototype circuit in the connection between the conductive tracks and the through connections; and providing where required for the prototype circuit, additional connections between through connections and conductive tracks of either or both groups thereof.

According to a second aspect of the invention a voltage printed circuit board including a plurality of through connections extending through an insulating substrate between first and second spaced parallel planes of the board, the through connections being arranged in a pattern of rows and columns; a plurality of first conductive tracks in said first plane each track extending between adjacent columns of through connections and connected to selected ones of the through connections in one or both columns adjacent thereto;

a plurality of second tracks in said second plane and extending between adjacent rows of the through connections and transversely of the first tracks and connected to selected ones of the through connections in one or both rows adjacent thereto;

the arrangement being such that none of the through-connections are connected to more than one track; whereby desired conductor configurations may be provided on the board by inter-connecting selected tracks by conductive links, between through connections which are connected to those selected tracks and where necessary, introducing discontinuities in said tracks.

Preferably the printed circuit board includes one or more planar conductive layers extending parallel to the first and second planes, selected ones of said through-connections being connected to said conductive layers, the arrangement being such that any through-connection connected to one of the conductive layers is isolated from the other layer or layers and is not connected to any of the conductive tracks.

Through-connections may be provided which are not connected to either the conductive tracks or the conductive layers, and which have a hole extending therethrough to receive connection pins of a component to be mounted on the printed circuit board.

The invention also envisages a printed circuit assembly including a printed circuit board as hereinbefore described and components mounted thereon with their connection pins projecting through the apertures, and conductive wire links wrapped around the projecting portions and soldered respectively to required through-connections.

BRIEF DESCRIPTION OF THE DRAWINGS

A multilayer printed circuit board embodying the present invention will now be described, by way of example, with reference to the accompanying drawing, in which.

DESCRIPTION OF PREFERRED EMBODIMENT

Figure 1:
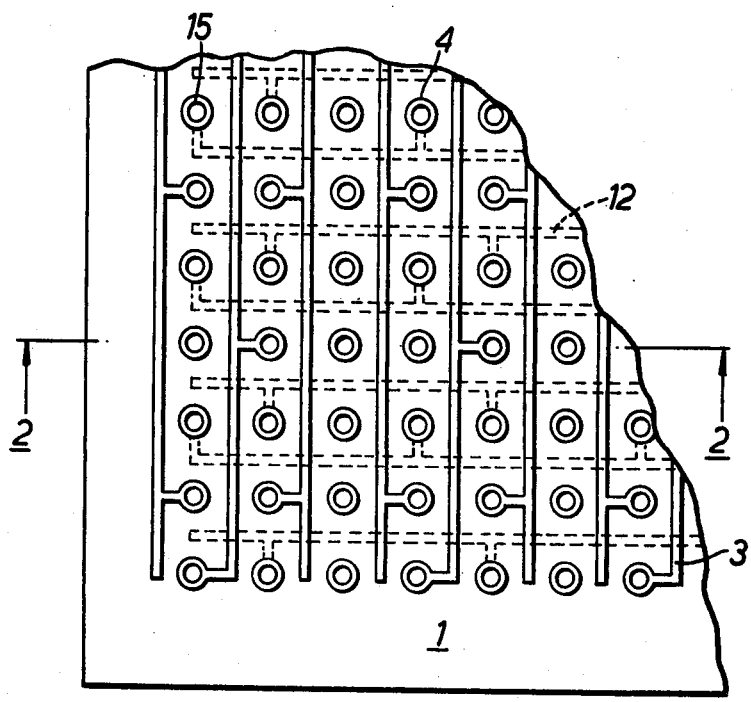
FIG. 1 is a plan view of a circuit board showing conductive tracks on opposite faces of the board, the tracks on the underside being shown in broken lines.

Referring now to the drawings, a printed circuit board 1 comprises a layer of conductive tracks 3 and conductive pads 4. The conductive pads 4 are arranged in rows and columns and are substantially equally spaced one from another. The tracks 3 are positioned between the columns of pads 4 and are connected to selected ones of the pads 4, each pad 4 being connected to one track only. A conductive plane 5 which is formed in two parts, 6 and 7 is separated from the layer 2 by an insulating layer 8. The parts 6 and 7 of the conductive plane 5 are comb-like in shape and are arranged so that their respective projecting portions intermesh but do not contact each other. Thus, the conductive plane 5 consists of two parts electrically isolated from one another to which different electrical potentials can be applied. A common earth plane 9 is separated from the conductive plane 5 by a further insulating layer 10 full stop. A further layer consisting of conductive tracks 12 and conductive pads 13 is separated from the common earth plane 9 by a third insulating layer 14. The conductive pads 13 are arranged in rows and columns and correspond in position with the conductive pads 4. The conductive tracks 12, however, are positioned between the rows of holes and not between the columns, i.e. the conductive tracks 12 extend at right angles to the conductive tracks 3. The conductive tracks 12 are connected to selected ones of the conductive pads 13, each pad again being connected to one track only. Also the pads of a corresponding pair of pads 4, 13 are connected to one track 3 or 12 only.

Through-connections are provided by means of plated-through holes 15 extending through the board and electrically connecting corresponding pairs of the conductive pads 4 and 13 on opposite sides of the circuit structure.

Figure 2:
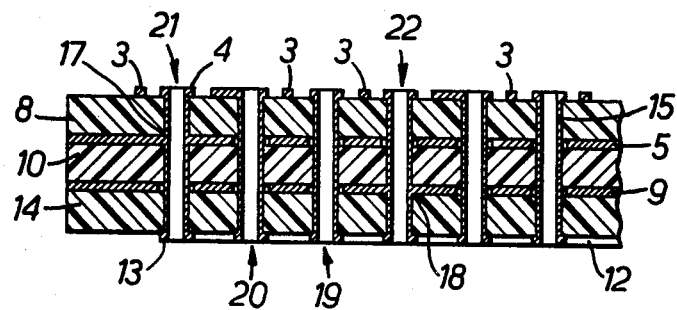
FIG. 2 shows a section through the board at 2—2.
Figure 3:
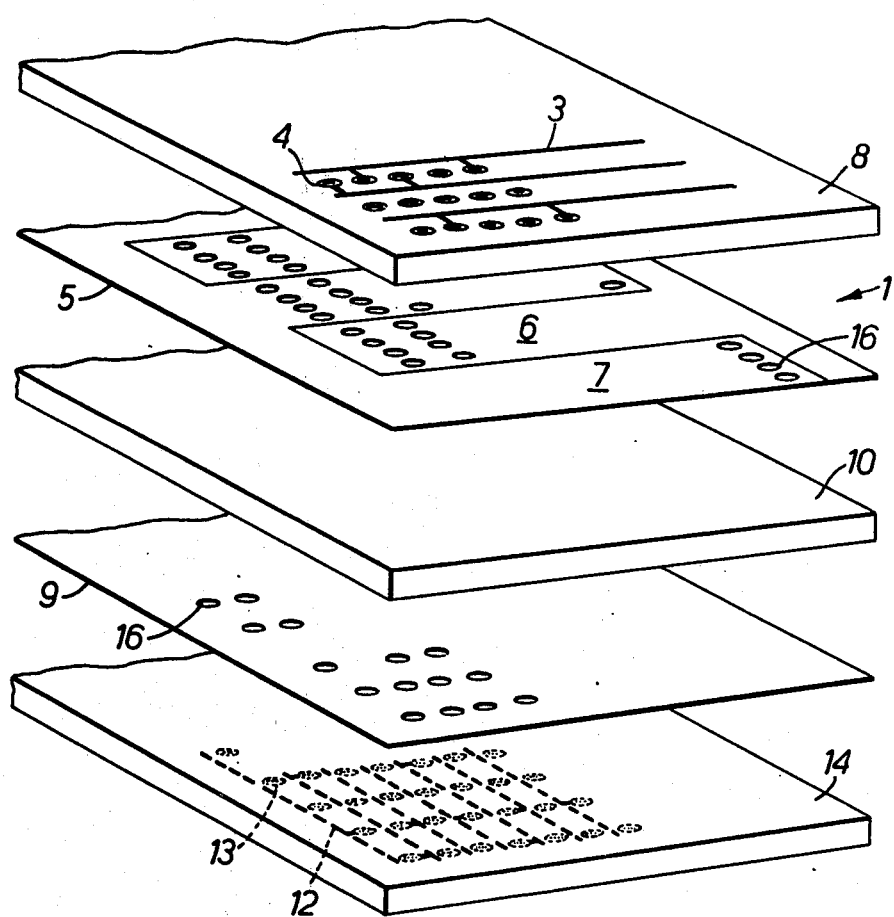
FIG. 3 shows an exploded view of the multilayer circuit board.

The conductive planes 5 and 9 have holes 16 etched therein at positions corresponding to the pads 4 and 13 except at positions where it is desired to bring connections from these planes to the surface of the board. These etched holes 16 have a diameter sufficiently greater than the diameter of the plated-through holes 15 in order to ensure that in drilling and plating the holes 15, the plating is electrically isolated from the conductive planes. At those positions where connections are made to the conductive planes, drilling the hole 15 pierces the conductive plane at 17 or 18 so that in plating the walls of the hole electrical connection is made to the plane so as to connect it to the pads 4 and 13 at that position as shown in FIG. 2.

It will be appreciated that a variety of different connections are provided at the pad positions on the board. At positions 19 the through hole 15 merely interconnects a pair of pads 4,13 which are not connected to any tracking. At positions 20 the pair of pads are interconnected by a through hole and one of the pads is connected to a conductive track on one surface of the board. At positions 21 and 22 the pair of pads are connected to one of the conductive planes 5, and 9 respectively.

The printed circuit board 1 is manufactured in conventional manner by using two double sided printed circuit board blanks each consisting of an insulating substrate carrying a copper or other metal layer on either side. One of the printed circuit board blanks is used to form the insulating layer 8 and the conductive plane 5, tracks 3 and pads 4. The other printed circuit board blank is used to form the insulating layer 10, the earth plane 9 and the further layer comprising the conductive tracks 12 and pads 13. The metal layers on the printed circuit board blanks are etched in conventional manner. After the holes 16 in the conductive plane 5 and the common earth plane 9 have been etched, the two etched boards are bonded together in spaced relationship using, for example, a so-called pre-preg layer consisting of a glass fibre/epoxy resin compound which forms the remaining insulating layer 10 full stop. The plated-through holes 15 are formed by drilling the board through the corresponding pairs of conductive pads 4 and 13 and plating the walls of the holes.

The described board forms a general-purpose multilayer circuit board which can be easily adapted for use in a number of different applications. The pattern of interconnections, which is repeated regularly throughout the board is one which has been shown to provide the necessary flexibility for such a universal arrangement.

In use, any of the conductive pads 4 and 13 on either outer surface of the board may be connected by hand wired links soldered into the plated-through holes. In addition it will be realised that discontinuities can easily be introduced into any of the conductive tracks 3 and 12 simply by removing a short length of the track. Thus, by selectively positioning the conductive links in conjunction with the selective introduction of discontinuities, a required pattern of conductors extending over the surfaces of the board and through the board via the plated-through holes is provided. Those plated-through holes at positions 19 not connected to conductive tracks 3 or 12 are utilised for the mounting of components such as dual-in-line integrated circuits, for example, which have a number of lateral connections. In the described embodiment the pitch of the plated-through holes is arranged to correspond with the pitch of the external connections of such a component. Pins of the components are inserted into the holes such that the free ends of the pins project from the surface of the board. Connections to the pins are made by wires wrapped around the free ends of the pins with the other ends of the wires being soldered into appropriate through holes which are connected to the conductive tracks. A row of holes at positions 19 may be provided adjacent an edge of the board (not illustrated) to accommodate pin connections of a connector for making external connections to the board. In addition, of course, components can be soldered directly into any of the platedthrough holes. Instead of making wire wrapped connections to the pins of components, each through-hole intended for reception of a pin of a component may be connected to a track 3 or 12 or by a short track to an adjacent through-hole whereby connections to the component may be made by links soldered to these adjacent through-holes.

While the illustrated embodiment shows single conductive tracks between adjacent rows or columns of pads if desired a greater number of tracks may be provided between the pads. Sufficient connections to the internal conductive planes are provided to ensure that the required earth and power connections are available for each dual-in-line integrated circuit or other component intended to be mounted on the board.

It will be appreciated that the pattern of through connections and tracks as described above may be provided over the whole area of a printed circuit board or, if desired, may be provided at a number of smaller areas on the board. For example, in cases where some required circuit connections are standardised for a number of circuits, as may be the case with power and earth connections, such connections may be provided in the manufacture of the board, as in conventional boards, while the smaller areas of tracks and through holes in accordance with the invention enable variable parts of the circuit to be completed by hand wired links between the through holes. Clearly, the connections provided in the manufacture of the board and those intended for hand wiring need not be in separate areas of the board but may be interlaced with one another.

If desired additional conductive tracks may extend alongside the tracks 3 and 12 which are not intended for interconnection purposes and hence do not have a plurality of through-connections connected to them. Such tracks may be utilised as screens between adjacent tracks 3 and 12 and may be connected to a common bus bar or may be connected to a through-connection which is connected to the internal earth plane or to a through-connection which can then be hand wired to the earth or power plane.

Instead of using a power plane 5 which is divided into electrically isolated parts 6 and 7 to enable more than one power supply to be provided, separate power planes may be provided for each supply and if required additional earth planes may be provided. For example a symmetrical arrangement may consist of one or more power planes sandwiched between two earth planes with the plane containing the interconnection tracks extending outside the earth planes.

The construction of circuit board described above provides interconnections having transmission line characteristics and hence can be used for fast logic circuits such as ECL as well as TTL. In order to preserve the transmission line characteristics of those tracks which are adjacent a conductive plane divided into separate parts, such as plane 5, which consists of interlaced projecting portions, the tracks are arranged so that they do not extend across the divisions between the parts. That is to say, in the embodiment described, the conductive tracks 3 extend parallel to the projections 6, 7.

We claim:

1. A multilayer printed circuit board for forming prototype circuits including:

an insulating substrate;

first and second planar conductive potential distribution layers bonded one on either side of the insulating substrate;

a first insulating layer secured to the first planar conductive layer and supporting a plurality of first spaced parallel conductive tracks on an outer face of the structure;

a second insulating layer secured to the second planar conductive layer and supporting a plurality of second spaced parallel conductive tracks on a further outer face of the structure opposite said one outer face, the second tracks extending perpendicular to said first tracks; and a plurality of conductive through connections extending between said outer faces of the structure and arranged in a pattern of rows and columns in positions located between adjacent conductive tracks, first ones of the conductive through connections being connected only to adjacent ones of said first conductive tracks, second ones of the conductive through connections being connected only to adjacent ones of said second conductive tracks, third ones of the conductive through connections being connected only to the first planar conductive layer and fourth ones of the conductive through connections being connected only to the second planar conductive layer, whereby desired conductor configurations may be provided by interconnecting selected tracks by conductive links between conductive through connections which are connected to those selected tracks and selectively introducing discontinuities in said tracks and whereby desired potentials for the circuit configurations are distributed through the structure by the first and second conductive layers and the third and fourth conductive through connections respectively.

2. A multilayer printed circuit board as claimed in claim 1, including a fifth group of conductive through connections which are isolated from both sets of conductive tracks and from both planar conductive layers and are arranged to receive connection leads of components.

3. A multilayer printed circuit board as claimed in claim 2, in which the first planar conductive layer includes a plurality of electrically isolated portions effective to distribute a plurality of potentials through the structure.

* * * * *